(12) United States Patent
Ji et al.

(10) Patent No.: US 9,113,584 B2
(45) Date of Patent: Aug. 18, 2015

(54) PRINTED CIRCUIT BOARD ASSEMBLY (75) Inventors: Hangfeng Ji, Hangzhou (CN);
Abraham Rudolf Balkenende, Heeze (NL); Hong Chen, Shanghai (CN)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 196 days.

(21) Appl. No.: 13/982,036

(22) PCT Filed: Jan. 30, 2012

(86) PCT No.: PCT/IB2012/050408
§ 371 (c)(1),
(2), (4) Date: Jul. 26, 2013

(87) PCT Pub. No.: WO2012/101611
PCT Pub. Date: Aug. 2, 2012

(65) Prior Publication Data
US 2013/0314885 A1 Nov. 28, 2013

(30) Foreign Application Priority Data

Jan. 30, 2011 (WO) ............... PCT/CN2011/070824

(51) Int. Cl.
H05K 7/00 (2006.01)
H05K 3/30 (2006.01)
H05K 3/22 (2006.01)
H05K 1/02 (2006.01)
H05K 3/32 (2006.01)
H05K 3/34 (2006.01)

(52) U.S. Cl.
CPC .............. H05K 3/305 (2013.01); H05K 3/22 (2013.01); H05K 1/0269 (2013.01); H05K 3/321 (2013.01); H05K 3/34 (2013.01); H05K 2201/09936 (2013.01); H05K 2203/047 (2013.01); H05K 2203/176 (2013.01); H05K 2203/178 (2013.01); Y10T 156/1089 (2015.01)

(58) Field of Classification Search
USPC .......................... 361/760, 817, 718; 257/678
See application file for complete search history.

(56) References Cited

U.S. PATENT DOCUMENTS

| 4,561,006 A | 12/1985 | Currie |
| 5,241,454 A | 8/1993 | Ameen et al. |
| 2003/0178470 A1 | 9/2003 | Tada et al. |

(Continued)

FOREIGN PATENT DOCUMENTS

WO 2007077594 A1 7/2007

OTHER PUBLICATIONS

K. Feldmann et al; "Platinen: Zerlegen Statt Wegwerfen. Okonzept Einer Demontage-Anlage Fuer Leiterplatten", Elektronik, IRL Press Limited, DE, vol. 43, No. 20, Oct. 4, 1994, pp. 48-50, 53, XP000445336.

*Primary Examiner* — Andargie M Aychillhum
(74) *Attorney, Agent, or Firm* — Yuliya Mathis (57) ABSTRACT The present invention relates to a printed circuit board assembly (10), said printed circuit board assembly comprising: a substrate (100); two or more electronic components which are categorized, wherein each component is secured to the substrate by securing means having a different predetermined thermal-release temperature, depending on which category said component belongs to. The invention furthermore relates to a method of assembling the printed circuit board assembly and a method of disassembling the printed circuit board assembly according to the invention.

10 Claims, 4 Drawing Sheets

(56) References Cited

U.S. PATENT DOCUMENTS

| | | |
|---|---|---|
| 2004/0181923 A1 | 9/2004 | Dills |
| 2004/0188497 A1 | 9/2004 | Gruber et al. |
| 2009/0033337 A1 | 2/2009 | Pasco |
| 2009/0152329 A1 | 6/2009 | Kim et al. |
| 2009/0184407 A1* | 7/2009 | Arvin et al. .................. 257/678 |
| 2010/0221586 A1* | 9/2010 | Rockenfeller ................. 429/50 |

* cited by examiner

PRINTED CIRCUIT BOARD ASSEMBLY

FIELD OF THE INVENTION

The present invention relates to a printed circuit board assembly and a method of assembling such a printed circuit board assembly, as well as a method of disassembling such a printed circuit board assembly.

BACKGROUND OF THE INVENTION

In view of the rapid increase of the amount of electronic waste (e-waste) worldwide, recycling of printed circuit board assembly (PCBA) scrap is very important in terms of environmental protection, material recovery, etc.

A printed circuit board assembly normally comprises many different types of electronic components, for example resistors, capacitors, inductors, diodes, transistors, ICs, etc. mounted on a substrate. The different components are mounted on the substrate either via surface mount technology (SMT) or through-hole technology (THT).

The different components have different lifetimes as well as various compositions. Some of the components could be re-used or contain materials of interest for re-use that are lost in a common recycling process due to intermixing with incompatible materials, while others need to be recycled, and still others pose a considerable environmental hazard that must be dealt with.

In current common recycling processes for printed circuit board assemblies the printed circuit board assembly is melted, (possibly with other materials) to separate valuable metals, which implies that all materials are intermixed. However, this results in the materials making up the electronic components being mixed, which makes it impossible to re-use components or completely recycle the different materials within the components.

Consequently, there is a need for a printed circuit board assembly, and a method of assembling such a printed circuit board assembly, which makes it easy to separate and collect various electronic components mounted on the printed circuit board assembly at the end of its useful life, and which further facilitates re-use of electronic components and/or recycling of the constituting materials of the electronic waste material.

SUMMARY OF THE INVENTION

The present invention, defined in the appended claims, provides a printed circuit board assembly, a method of assembling such a printed circuit board assembly and a method of disassembling one or more such printed circuit board assemblies, thereby fulfilling at least part of the needs defined above.

According to one aspect of the present invention, the printed circuit board assembly comprises a substrate and two or more electronic components, wherein the two or more electronic components are categorized, and each electronic component is secured to the substrate by a securing means having a predetermined thermal-release temperature and/or adhesive properties, depending on which category said component belongs to.

Alternatively, the two or more electronic components are categorized into two or more categories, and each electronic component is secured to the substrate by a securing means having a predetermined thermal-release temperature and/or adhesive properties different from the thermal-release temperature and/or adhesive properties of at least one securing means used to fasten the other electronic component(s) on the substrate.

The inventive printed circuit board assembly, defined in the independent claim, fulfils at least part of the requirements defined above by having the different components secured to the substrate categorized into different categories depending on, for example, the materials contained in the different components, or the expected lifetime of the component types. Each category of components is secured to the substrate by a securing means having a predetermined thermal-release temperature range and/or adhesive strength different from that of other securing means used to secure other categories of components on the substrate.

Accordingly, if there is a need to disassemble such a printed circuit board assembly at the end of its useful life or for another reason, this could be done by a) heating the printed circuit board assembly to the different predetermined thermal-release temperature ranges of the different securing means, starting with the one having the lowest thermal-release temperature, and removing the different component categories from the substrate at different times, or alternatively b) by heating the printed circuit board assembly to certain temperatures and applying external forces of a certain strength to the printed circuit board assembly so as to remove the different component categories from the substrate and collecting them separately, or alternatively by a combination of a) and b) above.

In addition, further sorting of the collected components is not required until the re-use or recycling processes are continued for the different component categories. The fact that the components are sorted into different categories increases the value of the collected components considerably, since the possibilities to re-use components or valuable material increases. Some component categories may still need further sorting in order to enable re-using selected components or recycling of valuable materials, but all further processing of the components or material is facilitated by the initial pre-sorting made possible by the present invention.

In one embodiment of the printed circuit board assembly, the electronic components on the substrate are categorized based on their composition to facilitate recycling of the materials in the component and/or re-use of the component.

In one embodiment of the printed circuit board assembly, the most frequently used types of electronic components on the substrate are secured on the substrate by the securing means having the lowest thermal-release temperature or the weakest adhesive strength at a certain temperature compared to that of other securing means used. The most frequently used type of electronic components can be for example resistors, capacitors, etc.

In one embodiment of the printed circuit board assembly, electronic components having similar compositions are categorized in the same category, and/or electronic components comprising similar environmentally hazardous material are categorized within the same category. In order to avoid too many different categories, and consequently too many types of securing means used during assembling the printed circuit board assembly, and also too many different temperature ranges and/or external forces for removing the components during disassembling the printed circuit board assembly, components having similar properties are preferably categorized into the same category.

In one embodiment of the printed circuit board assembly, the categories comprising the electronic components that are more sensitive to high temperatures, or have a higher possibility of re-use, for example ICs (integrated circuits), are preferably secured by securing means having a comparatively low thermal-release temperature or a comparatively weak adhesive strength at a certain temperature. Thus, such components can be removed from the printed circuit board assembly at a comparatively low temperature and are safeguarded from processes for separating other components that are conducted at a comparatively high temperature. Consequently, this is favourable, since the reliability or functionality of such components can be ensured.

In one embodiment of the printed circuit board assembly, an information label is printed or attached on the substrate to indicate the categorization of the electronic components and/or the characteristics of the securing means corresponding to each category. The use of such an information label will facilitate the separation of the components from the substrate and/or ensure that the components are recycled or re-used in the best possible way.

Alternatively, the information label can display the corresponding thermal-release temperatures of the various securing means. This information label can also be an electronic label like a RFID that is read out electronically. The label is useful during recycling/re-use processes as well as if rework or repair of the printed circuit board assembly is required.

In one embodiment of the printed circuit board assembly, the securing means are selected from the group composed of solders, electrically conductive or electrically non-conductive glues or any other securing means which electrically and/or mechanically connect the components to the substrate, or any combinations of said securing means. Alternatively, the securing means used for one printed circuit board assembly may comprise several types of solders with different thermal-release temperatures, and/or multiple glues with different softening temperatures. These securing means are favourable since they are available with different predetermined thermal-release temperatures or they have different adhesive properties at various temperatures, which for example means that they have a different adhesive strength at a certain temperature, and they have already been used for assembling the printed circuit board assemblies, which implies that only minor changes to the presently used processes are required.

In one embodiment of the printed circuit board assembly, the printed circuit board assembly comprises two different categories of electronic components, and each category is mounted on one side of the substrate. Thus, only two types of securing means are used, and consequently only one additional securing means is added compared with a conventional printed circuit board assembly process in which only one type of securing means is used. Alternatively, if components are present on two or more PCBAs in a single device, a similar strategy can be followed. In detail, for example, if these components can be categorized into two or more categories and each category can be secured on a substrate of one PCBA, then one PCBA can contain components that belong to only one particular category. Or, one of the PCBAs can contain components that belong to one particular category, while the other PCBA(s) contain components that either belong to other categories or that belong partly to the same category and partly to other categories.

The invention furthermore relates to a method of assembling a printed circuit board assembly. The method comprises the steps of: categorizing different electronic components to be secured on a substrate of the printed circuit board assembly; and securing each electronic component on the substrate by a securing means having a predetermined thermal-release temperature and/or adhesive properties depending on which category said component belongs to.

In one embodiment, the method comprises the steps of: categorizing the different electronic components to be secured on the substrate into two or more categories; securing different categories of electronic components on the substrate by securing means having different thermal-release temperatures and/or by securing means having different adhesive strength, starting with the category having the highest thermal-release temperature and/or the largest adhesive strength at a predetermined temperature, followed by the category having the second highest thermal-release temperature and/or the second largest adhesive strength at the predetermined temperature; after which any remaining electronic components are assembled until all electronic components are secured on the substrate by using securing means having step-wise reduced thermal-release temperatures and/or step-wise reduced adhesive strength. This method makes it possible to assemble a printed circuit board assembly such that it is comparatively easy to sort the various components to be removed from such a printed circuit board assembly at the end of its useful life, thereby facilitating possible re-use of valuable components as well as recycling of valuable materials.

In one embodiment of the method, the electronic components to be secured on the substrate by surface mount technology (also referred to as "SMT" components) are categorized in the same category and are electrically connected to the substrate by the same electrically conductive glue or solder.

The components to be assembled on the substrate by surface mount technology (also referred to as "SMT" components) are commonly first mechanically secured on the substrate by an electrically non-conductive glue or a sticky material so as to have them positioned on the substrate, and then they are electrically connected to the substrate by an electrically conductive glue or solder.

In one embodiment of the method, the components to be secured on the substrate by surface mount technology are categorized in the same category and are electrically connected to the substrate by the same electrically conductive glue or solder.

In a further embodiment of the method, the electronic components to be secured on the substrate by surface mount technology are further categorized into two or more sub-categories. Each sub-category of the electronic components is mechanically secured on the substrate by an electrically non-conductive glue or a sticky material different from that used to mechanically secure other sub-categories of the electronic components on the substrate, before being electrically connected to the substrate. And in a second step, the electronic components are electrically connected by the same electrically conductive glue or solder. This embodiment ensures that the components remain in the intended position until the electrically conductive glue or solder is applied. Preferably, said different electrically non-conductive glues or sticky materials are selected such that they will at least partly lose their adhesive strength only above the thermal-release temperature of the electrically conductive securing means.

The invention furthermore relates to a method of disassembling a printed circuit board assembly according to the embodiments described above.

The method comprises the steps of: a) heating the one or more printed circuit board assemblies to a first predetermined temperature range, which is sufficient to remove a first category of electronic components from the substrate(s) of the printed circuit board assemblies, while other categories of electronic components remain secured on the substrate(s); b) removing an external force from or applying an external force to the first category of electronic components on the substrate(s) to remove such electronic components from the substrate(s), and subsequently collecting such electronic components; c) heating the printed circuit board assemblies to a second predetermined temperature range higher than the first predetermined temperature range and sufficient to cause a second category of electronic components to be released from the substrate(s) while keeping the remaining categories of electronic components secured on the substrate(s), and/or applying a step-wise increasing external force to the second category of electronic components; d) removing the second category of electronic components from the substrate(s) and collecting such electronic components.

If there are any remaining electronic components on the substrate, the method further comprises a step of continuing to heat the printed circuit board assemblies to a third temperature range higher than the first and second temperature ranges and/or applying a further step-wise increasing external force to a third category of electronic components on the substrate(s) and collecting such electronic components. The first predetermined temperature range corresponds to the thermal-release temperature of the securing means which has the lowest thermal-release temperature among all securing means used having different thermal-release temperatures.

The method makes it possible to remove and collect the different component categories separately, which makes it considerably easier to sort different categories of components, and in addition facilitates re-use of components or recycling of materials contained in the different components in an effective way.

In one embodiment of the method, the method comprises a further step, which is performed before step a), and which comprises detecting information present on an information label printed or attached on the substrate(s) about the categorization of the electronic components and/or the characteristics of securing means corresponding to each category. This is an important and useful step which facilitates disassembly of the printed circuit board assembly.

In one embodiment of the method, the external forces are applied by e.g., a flow of air or brushes acting on the printed circuit board assemblies to ensure that the different categories of components are released from the substrate. The external forces ensure that all components of each category are released and collected correctly.

The thermal-release temperature used in this document relates to the thermal-release point (i.e. thermal-release temperature) for a solder, the softening temperature for glue, or a temperature that can cause a securing means to lose its securing strength to a certain level, thereby enabling release of the secured components from the substrate. For example, in the case of different glues, each glue should have an individual, so-called softening temperature at which the different glues will lose their adhesive strength to a same degree, and this softening temperature is referred to as the release temperature.

The different embodiments described above could be combined in different ways.

BRIEF DESCRIPTION OF THE DRAWINGS

These and other aspects of the invention will now be described in more detail, with reference to the appended drawings showing several currently preferred embodiments of the invention.

DETAILED DESCRIPTION OF EMBODIMENTS

The printed circuit board assembly according to the invention comprises a substrate and a number of electronic components secured to the substrate. The substrate is a carrier board for the different electronic components secured to it. The substrate is for example made of an epoxy polymer, a ceramic material or a paperboard provided with patterned metal (usually copper). Printed circuit board assemblies may comprise many different types of electronic components such as for example resistors, transistors and diodes secured on the substrate.

Commonly, these components are either mounted to the substrate 100 by "surface mount technology" (SMT), which means that the components are secured to the surface of the substrate by a securing means, or "through-hole technology" (THT), which means that leads, extending from the components, are mounted in holes in the substrate and secured to the substrate by securing means. The claimed invention is usable for both SMT and THT printed circuit board assemblies, as well as all other possible ways of mounting components to a substrate.

Different types of components comprise different materials. Some of these components are of high value, which makes them very interesting for re-use, while re-use of other components is not possible, or not economically interesting because of the cost associated with the re-use process and/or the reliability of the re-used components.

When re-use is not possible, the different materials constituting the components should be optimally recycled. As in the commonly used printed circuit board assembly recycling processes not all materials are compatible with the same way of processing, components are preferably first separated from the substrate on the basis of their main constituents. Furthermore, some components comprise materials that are hazardous for the environment and must therefore be treated separately in a specific way.

One object of the invention is to make it possible to re-use and recycle as much as possible of the different components and/or materials constituting the collected e-waste material.

This is achieved by categorizing (Q1) the different types of electronic components of the printed circuit board assembly. The categorization could be carried out based on for example the components' re-use value, composition, type/functionality, packaging, size, toxicity etc. The categorization could be done in different ways depending on the future purpose or steps performed in relation to the different component categories.

Components of the different component categories are secured (Q2) to the substrate by different types of securing means, for example solder or electrically conductive or electrically non-conductive glue having different predetermined thermal-release temperatures or different adhesive properties, or by other securing means with a predetermined thermal-release temperature or different adhesive properties, or, alternatively, by combinations of the above-mentioned different types of securing means that could be combined in order to make it possible to further improve the sorting of the different components.

If the securing means have different thermal-release temperatures, this means that by heating the aggregate of printed circuit board assemblies to the thermal-release temperature of the securing means which has the lowest thermal-release temperature among all securing means having a thermal-release temperature or temperature range, the first component category, secured by the above mentioned securing means, having the lowest thermal-release temperature will be released from the substrate while all the other component categories remain on the substrate. The first category of components are collected and removed for possible further separating and process steps before the remaining waste material is heated further to the second lowest thermal-release temperature of the securing means. When the remaining e-waste material is heated to the thermal-release temperature of the securing means used for the second component category, the second category of components can be collected and removed for further processing.

This stepwise increase of the heating temperature is continued until all component categories are removed from the substrate and only the substrates, possibly with one remaining category of components compatible with substrate recycling, and possibly other waste material, remain as a last fraction of the separation process. This means that all different component categories have been removed from the substrate and in the same process sorted according to the predetermined categories, which is essential in order to make it possible to take care of the different components/materials in the best possible way.

Alternatively, securing means with different adhesive properties can be used. In this case, the printed circuit board assembly is heated to a certain temperature at which the first category of components can be detached by a relatively small external force. When that temperature is reached, the printed circuit board assembly is exposed to external forces acting on the different components. The force is initially small to release the component category secured by the securing means having the smallest adhesive strength. The force is then increased stepwise in order to remove and collect the different component categories separately.

Alternatively, the printed circuit board assembly is heated to a certain temperature at which the first category of components can be detached by a relatively small external force. When that temperature is reached, the printed circuit board assembly is exposed to a certain (small) external force acting on the different components of the assembly to release the first category of components. After the first category of components have been released, the printed circuit board assembly is heated further to a higher temperature at which the second category of components can be detached by a relatively small external force. When that temperature is reached, the printed circuit board assembly is exposed to a certain (small) external force acting on the different components, whereby the second category of components can be released upon being exposed to the external force at this temperature. The temperature is then increased stepwise in order to remove and collect the different component categories separately. Alternatively, one can tune both the temperature and the external force.

In one embodiment of the printed circuit board assembly, some of the different component categories are secured by securing means having different thermal-release temperatures, while other component categories are secured by securing means having different adhesive properties. For example, first category components are secured by a first solder, second category components by a first glue, third category components by a second glue, and so on. By combining the use of different securing means, selected component categories can be released and collected separately.

In order to further improve the printed circuit board assembly and the recycling process, frequently used components and/or components having a large size are categorized and secured to the substrate by securing means with low thermal-release temperatures to reduce the energy consumption that would be involved in heating more waste material than necessary to higher temperatures.

In one embodiment of the printed circuit board assembly, component categories that are more sensitive to high temperatures or have a higher possibility of re-use are secured by low-thermal-release-temperature securing means in order to increase the reliability of the components secured on the substrate or the functionality of the re-used components.

In order to further improve the printed circuit board assembly and the method of recycling the printed circuit board assembly, an information label is printed on the substrate in order to indicate how the different components are categorized, and which securing means are used for each of the categories.

Before the recycling process is initiated, the printed circuit board assemblies are sorted so that printed circuit board assemblies categorized in the same way are identified and treated simultaneously.

In order to further improve the recycling process, the heated printed circuit board assemblies could be exposed to external forces to ensure that all components within each category actually are released from the substrate once the securing means have melted.

Even though the different securing means have different predetermined thermal-release temperatures, it is favourable to select securing means with release temperatures that differ from each other by at least a few degrees, preferably 10 to 20 degrees, in order to ensure that the components of the different categories are not unintentionally released and mixed during the recycling process.

Based on the teachings described above, some specific embodiments are given below for easy understanding of the present invention.

Figure 1:
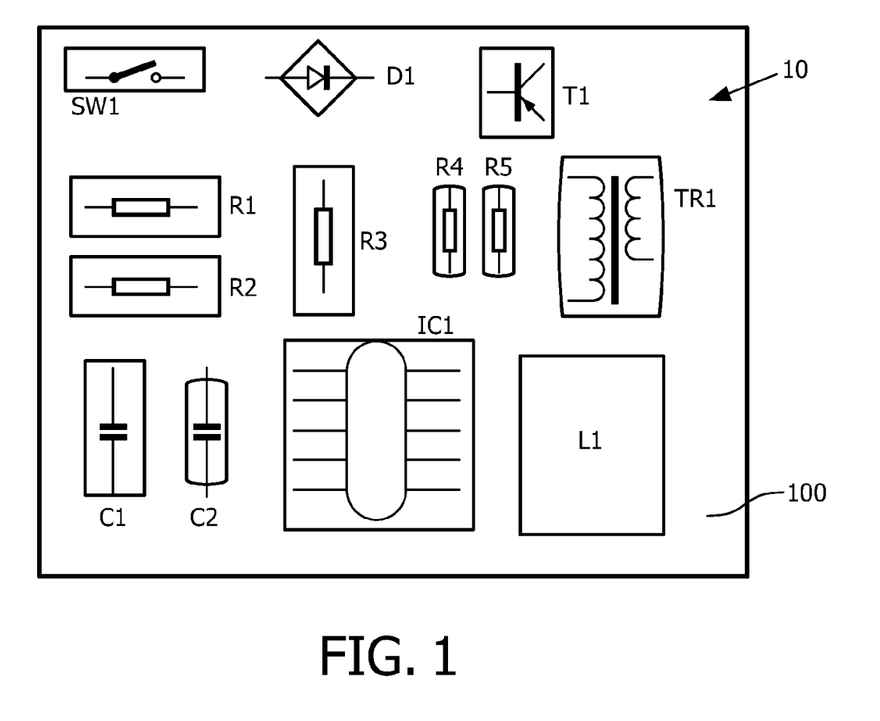
FIG. 1 shows a printed circuit board assembly according to embodiments of the invention.

FIG. 1 shows a printed circuit board assembly 10 according to embodiments of the invention, and the printed circuit board assembly 10 comprises a substrate 100 and a number of electronic components secured to the substrate 100. The substrate 100 is a carrier board for the different components secured to it. Printed circuit board assembly 10 may comprise many different types of electronic components such as resistors R1-R5, transistor T1, transformer TR1, capacitor C1-C2, inductor, integrated circuit (IC) IC1, switch SW1 and diodes D1 secured on the substrate 100. In detail, in one embodiment, resistors R1-R3 are THT resistors (e.g., wirewound resistors, carbon film resistors) and resistors R4-R5 are SMT ceramic resistors, transistor T1 is a bipolar junction transistor or field-effect transistor, transformer TR1 is a transformer wound with copper coils, capacitor C1 is a THT capacitor (e.g. ceramic capacitor, electrolytic capacitor) and capacitor C2 is a SMT capacitor (e.g. ceramic capacitor, electrolytic capacitor, or tantalum capacitor), switch SW1 is an electronic switch based on a transistor, diode D1 is a semiconductor diode. L1 is a place for printing or attaching relevant information regarding the categorization of the electronic components and/or the securing methods and/or the thermal-release temperatures/adhesive properties of the securing means used.

Figure 2:
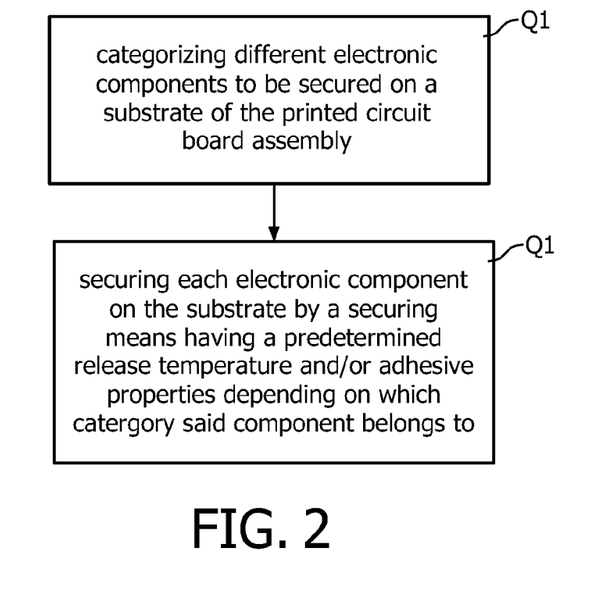
FIG. 2 illustrates the main steps of the method of assembling the printed circuit board assembly 10.

FIG. 2 illustrates the steps in a method of assembling the printed circuit board assembly 10. Before the components are secured on the substrate 100, in step S1, they are categorized into different categories or sub-categories. For instance, they are first categorized according to whether they belong to the SMT or THT component-type. Thus, resistors R4-R5 and capacitor C2 are categorized in a first category as SMT components and the rest of the above mentioned components can be categorized in a second category as THT components. Alternatively, these components in the first and second categories can be further categorized into different sub-categories. For example, resistors R4-R5 can be further categorized in a first sub-category and capacitor C2 can be further categorized in a second sub-category, and the sub-categorization can further be based on whether or not the components are environmentally hazardous. Other components in the second category can be in a third sub-category in consideration of their rest value for recycling so as to make sure that the material of these components can be used to manufacture other goods. Transformer TR1 and IC1 can be further categorized in a fourth sub-category due to their comparatively high rest value for re-use.

Figure 3:
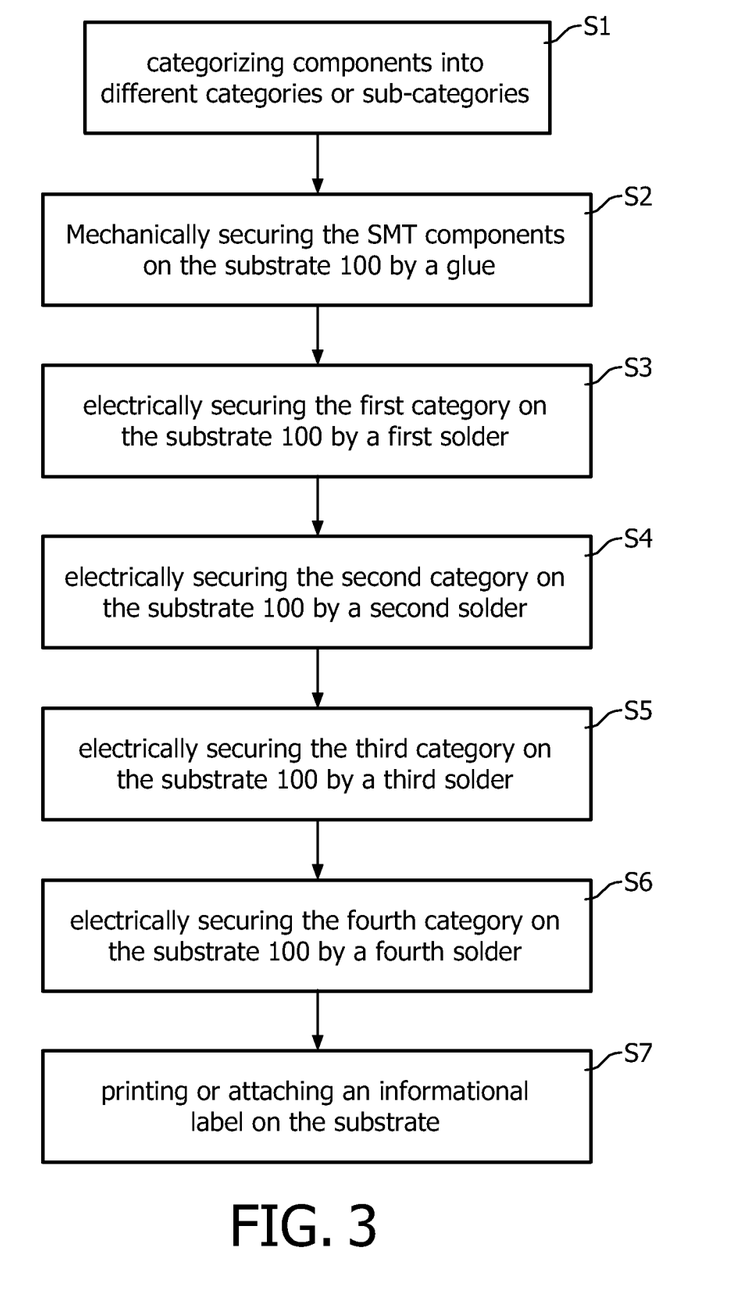
FIG. 3 illustrates the steps of the method of assembling the printed circuit board assembly 10 according to one embodiment.

Thus, based on the above categorization, when assembling the printed circuit board assembly 10, the following further steps can be taken by way of example. First, in step S2, resistors R4-R5 in the first sub-category and capacitor C2 in the second sub-category are secured on the substrate 100 by a glue, e.g. 2035Z-SERIES from Permacol, which has a softening temperature of about 100° C. During this step S2, these SMT components are positioned on and mechanically secured to the substrate. Then, in step S3, resistors R4-R5 in the first sub-category are secured on the substrate by a first solder, e.g. a solder that is mainly composed of 65Sn/25Ag/10Sb which has a melting temperature of about 233° C. In step S4, capacitor C2 in a second sub-category is secured on the substrate by a second solder, e.g. solder that is mainly composed of 93.5Sn/3Sb/2Bi/1.5Cu, which has a melting temperature of about 218° C. In step S5, the rest of the components in the third sub-category are secured on the substrate by a third solder, e.g. a solder that is mainly composed of 91Sn/9Zn, which has a melting temperature of about 199° C. In step S6, transformer TR1 and IC1 of the fourth sub-category are secured on the substrate by a fourth solder, e.g. a solder that is mainly composed of 48Sn/52In, which has a melting temperature of about 118° C. During steps S2-S5, these components are electrically secured on the substrate.

Alternatively, a further step S7 can be carried out comprising printing or attaching an information label on the substrate to indicate the categorization of the electronic components and the characteristics of various securing means corresponding to each category. The characteristics of various securing means can be for example the name and/or main composition of each glue and/or solder, their thermal-release temperatures, etc.

Optionally, in other embodiments, the step S2 can comprise securing resistors R4-R5 in the first sub-category on the substrate 100 by a first glue, e.g. 2035Z-SERIES from Permacol, which has a softening temperature of about 100° C., and securing capacitor C2 in the second sub-category on the substrate 100 by a second glue, e.g. Epibond® 7275 adhesives from Alpha Metals UK, which has a softening temperature of about 80° C. Thus, steps S3 and S4 of electrically securing the SMT components can also be carried out using a same type of solder, so that fewer solder types will be used.

Figure 4:
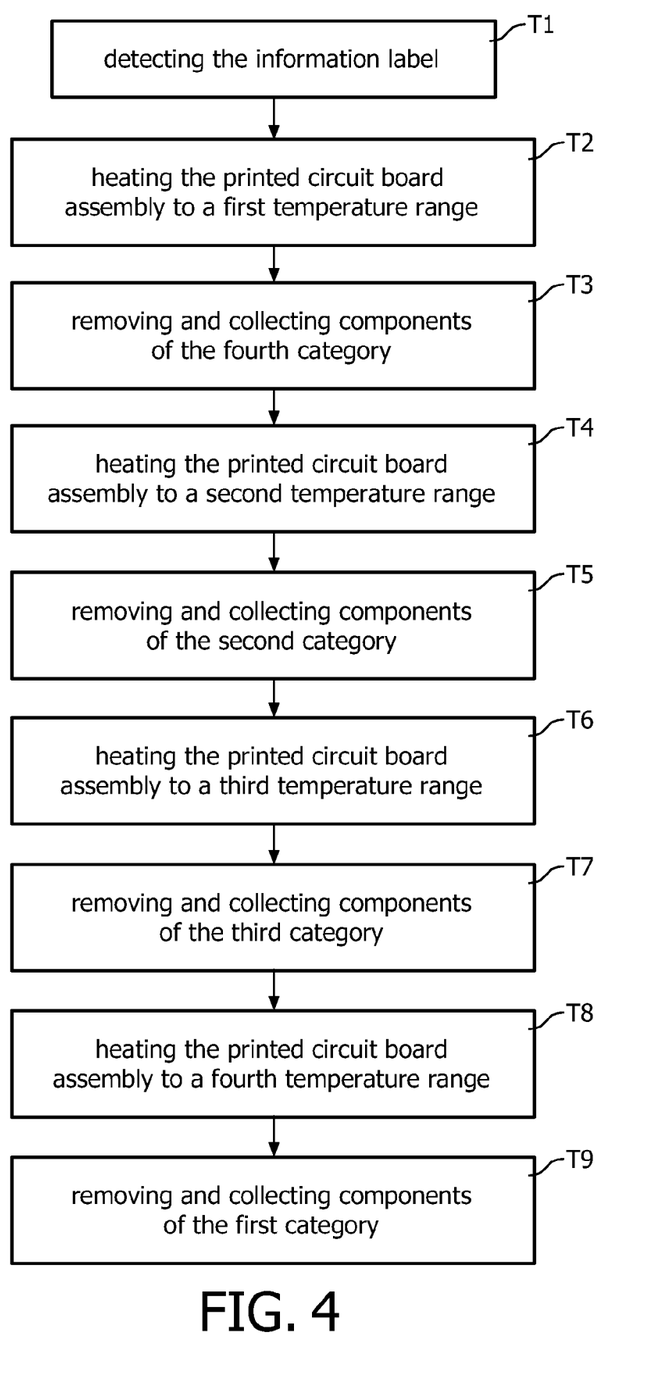
FIG. 4 illustrates the steps of the method of disassembling the printed circuit board assembly 10 according to one embodiment.

When the printed circuit board assembly 10 described in the above specific embodiment is at the end of its useful life and is recycled as a whole, the steps as shown in FIG. 4 can be carried out to disassemble it in order to collect different components for re-use or recycling, or for further processing of environmentally hazardous components.

First, in step T1, the information label printed on the substrate will be detected to obtain information about the categorization of the electronic components and the characteristics of securing means corresponding to each category. Step T2 will be carried out by heating the printed circuit board assembly to a first predetermined temperature range, e.g. 118° C.-125° C., which is sufficient to remove transformer TR1 and IC1 of the fourth category from the substrate while keeping other categories of electronic components secured on the substrate; Then, in step T3, transformer TR1 and IC1 are removed from the substrate and subsequently collected in a container. Alternatively, in step T3, an external force can be applied to the transformer TR1 and IC1 to help remove them from the substrate. In step T4, the printed circuit board assembly is heated to a second predetermined temperature range higher than the first predetermined temperature range and sufficient to release capacitor C2 in the third category from the substrate while keeping remaining categories of electronic components secured on the substrate, e.g. 199° C.-205° C. In step T5, capacitor C2 in the second category is removed from the substrate and collected for example in a second contrainer. In step T6, the printed circuit board assembly is heated to a third temperature range higher than the first and second temperature ranges, e.g. 218° C.-225° C. In step T7, resistors R4-R5 in the second category are removed from the substrate and collected for example in a third container. In step T8, the printed circuit board assembly is heated to a fourth temperature range, e.g. 233° C.-240° C. In step T9, the rest of the components in the first category are removed from the substrate and collected for example in a fourth container. Thus, all components are separated from the substrate step by step and collected in a proper order for further processing.

Figure 5:
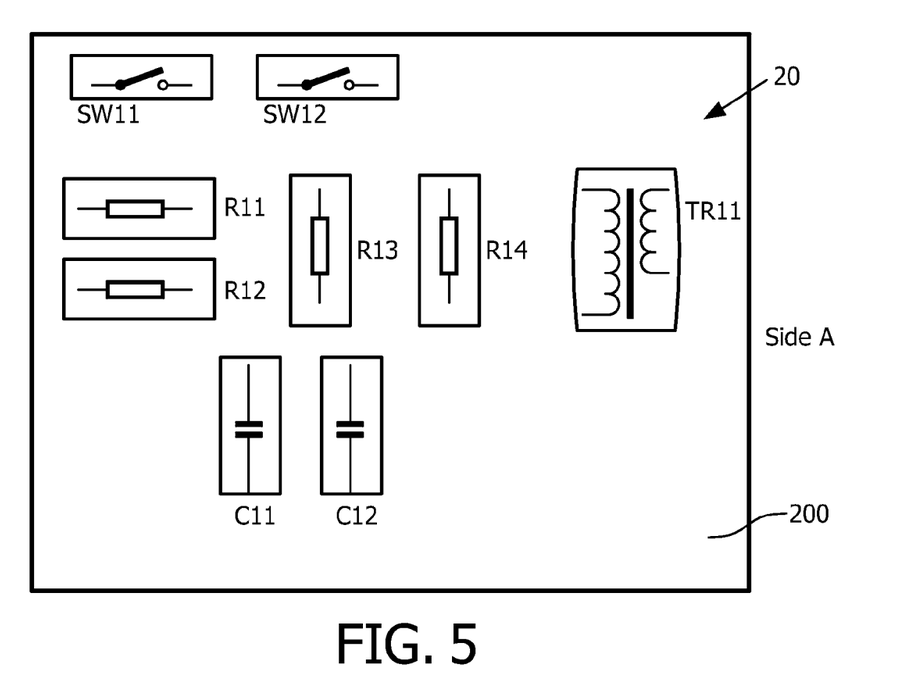
FIGS. 5 and 6 shows another printed circuit board assembly according to embodiments of the invention.
Figure 6:
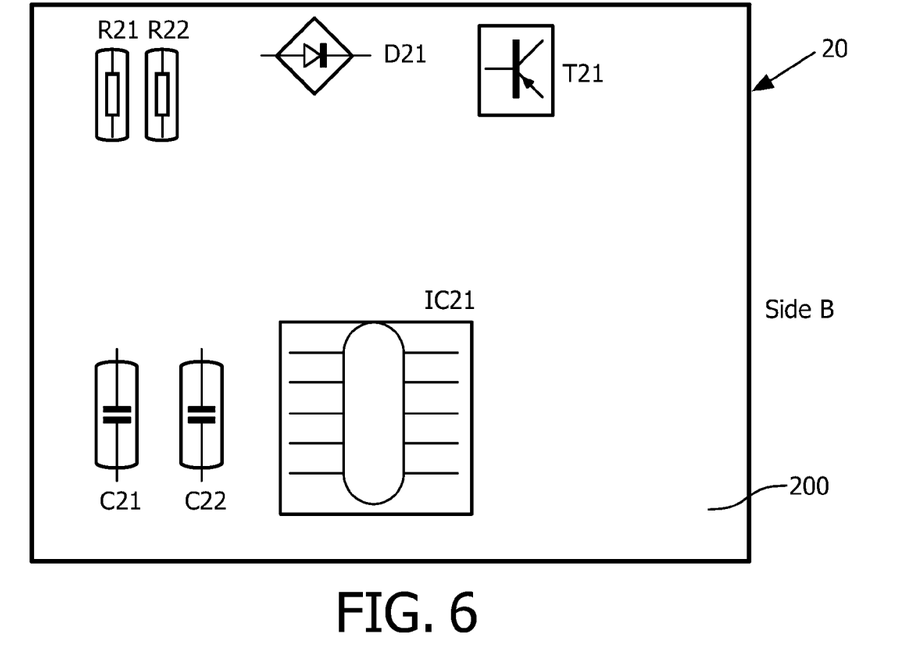

It can be understood that the above categorization of the components is only an example; there are many different criteria for categorizing these components into different categories or sub-categories, but a general principle is that the categorization serves to facilitate the sorting of components with a view to recycling or re-using the components after they have been removed from the substrate. For example, according to the materials or compositions of components, electronic switch SW1, semiconductor diode D1, bipolar junction transistor T1, field-effect transistor T1, IC1 can be categorized in a category due to their materials including semiconductor materials (Si, Ge, GaAs, etc); and the rest can be categorized in another category due to their non-semiconductor material compositions. In another embodiment, the components are categorized into two categories based on their sizes, as shown in FIGS. 4 and 5 of another printed circuit board assembly 20, i.e. all small components like diode D21, transistor T21, SMT resistors R21 and R22, SMT capacitors C21 and C22, and IC IC21 are secured on side B of a substrate 200, while other components like transformer TR11, THT capacitors C11 and C12, THT transistors R11-R14, and electronic switches based on transistor SW11 and SW12 are secured on side A (the opposite side of side B) of the substrate 200.

Different embodiments of the present invention have been described above. These embodiments could of course be combined or modified without departing from the scope of the invention that is defined by the appended claims.

The invention claimed is:
1. A printed circuit board assembly comprising:
a substrate; and
two or more electronic components which are categorized, wherein each electronic component is secured to the substrate by a securing means having a predetermined thermal-release temperature and/or adhesive properties, depending on which category said component belongs to;

wherein the two or more electronic components are categorized into two or more categories, and each electronic components of one category is secured to the substrate by a securing means having a predetermined thermal-release temperature and/or adhesive properties different from the thermal-release temperature and/or adhesive properties of at least one securing means used to fasten electronic components of other categories on the substrate;

wherein the electronic components on the substrate are categorized based on their composition to facilitate recycling of materials in the component and/or re-use the function of the component; and/or;

wherein the most frequently used type of electronic components on the substrate are secured on the substrate by the securing means having the lowest thermal-release temperature or weakest adhesive strength at a certain temperature compared to that of other securing means used; and/or;

wherein electronic components of similar composition are categorized in the same category while electronic components to different compositions are categorized in different categorys; and/or wherein those electronic components comprising similar environmentally hazardous materials are categorized within the same category while those electronic components comprising different environmentally hazardous materials are categorized within different categories; and/or wherein the categories comprising the electronic components that are more sensitive to high temperatures or have a higher possibility of re-use are secured by securing means having a comparatively low thermal-release temperature or a comparatively weak adhesive strength at a certain temperature.

2. Printed circuit board assembly according to claim 1, wherein an information label is printed or attached on the substrate to indicate the categorization of the electronic components and/or the characteristics of securing means corresponding to each category.

3. Printed circuit board assembly according to claim 1, wherein the securing means are selected from the group composed of solders, electrically conductive or electrically nonconductive glues or any other securing means which electrically and/or mechanically connect the components to the substrate, or any combination of said securing means.

4. Printed circuit board assembly according to claim 1, wherein the printed circuit board assembly comprises two different categories of electronic components and each category is arranged on one side of the substrate.

5. Method of disassembling one or more printed circuit board assemblies according to claim 1, comprising the steps of:
a) heating the one or more printed circuit board assemblies to a first predetermined temperature range which is sufficient o remove a first category of electronic components from the substrate(s) of the printed circuit board assemblies while keeping other categories of electronic components secured on the substrate(s);
b) removing an external force from or applying an external force to the first category of electronic components on the substrate(s), to remove such electronic components from the substrate(s), and subsequently collecting such electronic components;
c) heating the printed circuit board assemblies to a second predetermined temperature range higher than the first predetermined temperature range and sufficient to release a second category of electronic components from the substrate(s) while keeping the remaining categories of electronic components secured on the substrate(s), and/or applying a stepwise increasing external force to the second category of electronic components;
d) removing the second category of electronic components from the substrate(s) and collecting such electronic components the method further comprising a step of continuing to heat the printed circuit board assemblies to a third temperature range higher than the first and second temperature ranges and/or applying a further stepwise increasing external force to a third category of electronic components on the substrate(s) and collecting such electronic components.

6. Method according to claim 5, comprising a further step, which is performed before step a), and which comprises detecting information on an information label printed on the substrate(s) about the categorization of the electronic components and/or the characteristics of securing means corresponding to each category.

7. Method according to claim 5, wherein the first predetermined temperature range corresponds to the thermal-release temperature of the securing means which has the lowest thermal-release temperature among all securing means used having different thermal-release temperatures.

8. Method of assembling a printed circuit board assembly, said method comprising the steps of:
categorizing different electronic components to be secured on a substrate of the printed circuit board assembly into two or more cetegories;
securing each electronic component on the substrate by a securing means having a predetermined hermal-release temperature and or adhesive properties depending on which category said component belongs to, wherein each electonic component of one category is secured to the substrate by a securing means having a predetermined thermal-releas temperature and/or adhesive properties different from the thermal-release temperature and/or adhesive properties of at least one securing means used to fasten electronic components of other categories on the substrate,
starting with the category secured by the securing means having the highest thermal-release temperature and/or the largest adhesive strength at a predetermined temperature and followed by the category secured by th securing means having the second highest thermal-release temperature and/or the second largest adhesive strength at the predetermined temperature; and continuing to assemble any remaining electronic components until all electronic components are secured on the substrate by using securing means having stepwise reduced thermal-release temperatures and/or a stepwise reduced adhsive strength;
wherein the step of categorizing (Q1) comprises categorizing the electronic components on the substrate based on their compostion to facilitate recycling of the materials in the component and/or re-use of the function of the component;
and/or wherein the most frequently used type of electronic components on the substrate are secured on the substrate by the securing means having the lowest thermal-release temperature or weakest adhesive strength at a certain temperature compared to that of other securing means used;
and/or wherein wherein the step of categorizing (Q1) comprises categorizing electronic components of similar compostion in the same category while electonic components of different compositions are categorized in different categories;

and/or wherein the step of categorizing (Q1) comprises categorizing those electronic components comprising similar environmentally hazardous materials within the same category while those electronic components comprising different environmentally hazardous materials are catergorized within different categories;

and/or wherein the categories comprising the electronic components that are more sensitive to high temperatures or have a higher possibility of re-use are secured by securing means having a comparatively low thermal-release temperature or a comparatively weak adhesive strength at a cerain temperature.

9. Method according to claim 8, wherein the electronic components to be secured on the substrate by surface mount technology are categorized in the same category and are electrically connected to the substrate by the same electrically conductive glue or solder.

10. Method according to claim 9, wherein the electronic components to be secured on the substrate by surface mount technology are further categorized into two or more sub-categories, and each sub-category of the electronic components are mechanically secured on the substrate by an electrically non-conductive glue or a sticky material different from that used to mechanically fasten other sub-categories of the electronic components on the substrate before being electrically connected to the substrate.

* * * * *